United States Patent [19]

McGinn et al.

[11] Patent Number: 4,557,794

[45] Date of Patent: Dec. 10, 1985

[54] METHOD FOR FORMING A VOID-FREE MONOCRYSTALLINE EPITAXIAL LAYER ON A MASK

[75] Inventors: Joseph T. McGinn, Raritan Township, Hunterdon County; Lubomir L. Jastrzebski, Plainsboro; John F. Corboy, Jr., East Amwell Township, Hunterdon County, N.J.

[73] Assignee: RCA Corporation, Princeton, N.J.

[21] Appl. No.: 609,504

[22] Filed: May 7, 1984

[51] Int. Cl.[4] .............................................. C30B 25/04
[52] U.S. Cl. .................................................... 156/612
[58] Field of Search ........................ 156/610, 612, 613; 148/175

[56] References Cited

U.S. PATENT DOCUMENTS 3,951,694  4/1976  Monfret ............................... 148/1.5
4,522,662  6/1985  Bradbury et al. .................... 148/175

OTHER PUBLICATIONS

"Growth Process of Silicon Over $SiO_2$ by CVD: Epitaxial Lateral Overgrowth Technique", L. Jastrzebski et al., *Journal of Electrochemical Society*, vol. 130, No. 7, pp. 1571–1580, Jul. 1983.

"Defect Characterization in Monocrystalline Silicon Grown Over $SiO_2$", J. T. McGinn et al., *Journal of Electrochemical Society*, vol. 131, No. 2, pp. 398–403, Feb. 1984.

"Growth Rate Anisotropy and Morphology of Autoepitaxial Silicon Films from $SiCl_4$", C. H. J. Van Den Brekel, *Journal of Crystal Growth*, vol. 23, pp. 259–266, 1974.

International Publication No. WO81/02948, "Methods of Producing Sheets of Crystalline Material and Devices Made Therefrom", MIT, published Oct. 15, 1981.

*Primary Examiner*—Hiram H. Bernstein
*Attorney, Agent, or Firm*—Birgit E. Morris; Donald S. Cohen; Kenneth R. Glick

[57] ABSTRACT

A method for forming a layer of monocrystalline diamond cubic material on a mask comprises initially providing a substrate having a monocrystalline surface which is parallel to a {100}-type crystallographic plane. A mask is then formed on the substrate, the mask including at least two apertures and each aperture including an edge which is oriented between 8° and 14° from a particular <001> direction on the surface. The aperture edges are mutually parallel and in mutual opposition and the mask apertures each expose a monocrystalline surface portion of the substrate. The diamond cubic material is then epitaxially grown through the apertures and over the mask so as to form a monocrystalline layer of substantially uniform quality overlying the mask between the edges of the apertures.

4 Claims, 10 Drawing Figures

APERTURE EDGE 12° FROM [010]

METHOD FOR FORMING A VOID-FREE MONOCRYSTALLINE EPITAXIAL LAYER ON A MASK

The present invention relates to a method for epitaxially forming a monocrystalline layer of a material having a diamond cubic structure, such as silicon or germanium. More particularly, it relates to a method for fabricating a crystallographically high quality layer on an apertured mask which is disposed on an appropriate crystalline substrate.

BACKGROUND OF THE INVENTION

A method for fabricating a monocrystalline silicon layer over a non-crystalline mask layer such as silicon dioxide is disclosed in co-pending and commonly assigned U.S. Patent application Ser. No. 608,544 which is a continuation of Ser. No. 338,958, METHOD FOR GROWING MONOCRYSTALLINE SILICON THROUGH A MASK LAYER, J. F. Corboy, Jr. et al. filed Jan. 12, 1982 and in Ser. No. 553,305, METHOD FOR GROWING MONOCRYSTALLINE SILICON ON A MASK LAYER, J. F. Corboy, Jr. et al. filed Nov. 18, 1983. In the fabrication technique disclosed therein, a semiconductor substrate having a monocrystalline portion at a surface thereof is provided. A mask layer of a material such as silicon dioxide is formed over the substrate surface and an aperture corresponding to a monocrystalline portion of the substrate is generated in the mask layer. Silicon is then epitaxially deposited in a two stage process which is now referred to as epitaxial lateral overgrowth (ELO).

In the first stage of the ELO process silicon is deposited from a gas mixture which comprises a silicon-source gas. This forms monocrystalline silicon on exposed monocrystalline silicon surfaces although it also forms non-monocrystalline silicon on the mask layer. In the second stage both the deposited monocrystalline silicon and any non-monocrystalline silicon formed on the mask layer are exposed to a silicon-etching gas so as to remove the non-monocrystalline silicon from the mask layer while retaining a portion of the deposited monocrystalline silicon. When this deposition and etching cycle is repeated an appropriate number of times a monocrystalline silicon layer is ultimately formed on the mask layer. Following the formation of a monocrystalline silicon layer on the mask layer, cavities can be formed by etching the monocrystalline silicon in areas corresponding to the mask apertures. This will create a plurality of electrically isolated monocrystalline silicon islands which might be effectively utilized in silicon-on-insulator (SOI) device applications.

In commonly assigned U.S. Pat. No. 4,482,422, METHOD FOR GROWING A LOW DEFECT MONOCRYSTALLINE LAYER ON A MASK, J. T. McGinn et al. issued Nov. 13, 1984, the quality of the deposited moncrystalline silicon is disclosed to be strongly dependent upon the configuration and orientation of the mask aperture(s). This reference teaches that when performing ELO from a substrate surface which is parallel to a {100}-type plane the edges of the mask apertures should be parallel to one of the <010>-type directions lying in that plane. It is also disclosed that to produce high quality crystalline material the aperture shape should be rectangular with a length/width aspect ratio as high as other design and processing constraints will permit.

Although methods for forming high quality monocrystalline silicon formed by ELO have been disclosed, a problem nonetheless exists with respect to the inclusion of a void in a portion of the monocrystalline layer. As described in U.S. Pat. No. 4,482,422, a void is formed in the monocrystalline layer adjacent to the mask substantially midway between neighboring mask apertures. This void, which is inherent in the previously described processing, can pose a significant problem when forming SOI islands having relatively thin monocrystalline silicon layers. In an effort to overcome this problem, the present invention was discovered.

SUMMARY OF THE INVENTION

A method for forming a layer of monocrystalline diamond cubic material on a mask comprises initially providing a substrate having a monocrystalline surface which is parallel to a {100}-type crystallographic plane. A mask is then formed on the substrate, the mask including at least two apertures and each aperture including an edge which is oriented between 8° and 14° from a particular <001> direction on the surface. The aperture edges are mutually parallel and in mutual opposition and the mask apertures each expose a monocrystalline surface portion of the substrate. The diamond cubic material is then epitaxially grown through the apertures and over the mask so as to form a monocrystalline layer of substantially uniform quality overlying the mask between the edges of the apertures. This process significantly reduces the size of the void in the monocrystalline layer adjacent to the mask and between the edges of the apertures.

BRIEF DESCRIPTION OF THE DRAWING

In FIG. 6a the aperture edges are parallel to a particular <001> direction. FIGS. 6b through 6e represent 4°, 8°, 12° and 16° misorientations from this particular <001> direction.

DETAILED DESCRIPTION

In the semiconductor industry, monocrystalline material such as silicon is commonly grown in the form of a cylindrical boule having a particular crystallographic orientation. The boule is then sliced transverse to its cylindrical axis so as to yield a plurality of disc-shaped monocrystalline wafers. Thus, the wafers which are cut from the boule have planar major surfaces which are parallel to a particular crystallographic plane.

Figure 1:
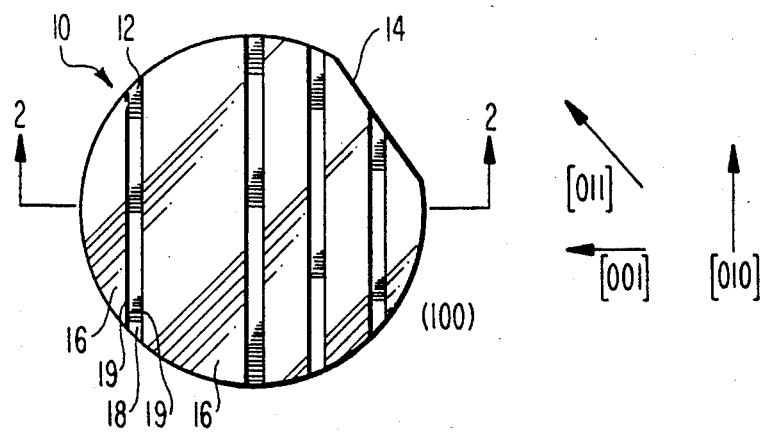
FIG. 1 is a plan view of a major surface of a conventional semiconductor wafer having a conventionally oriented apertured mask disposed thereon.

Illustrated in FIG. 1 is a conventionally fabricated disc-shaped monocrystalline silicon wafer 10 having a substantially circular major surface 12 which is parallel to a plane in the {100} family of planes. For clarity of description, the surface 12 of the wafer 10 will hereinafter be referred to as the (100) plane although it should be recognized that the surface 12 can equivalently represent any of the {100}-type planes. Accordingly, the wafer 10 will be referred to as a (100) wafer.

In semiconductor device fabrication it is desirable to use (100) silicon wafers in applications where silicon dioxide is to be formed on the surface 12, as it is, for example, in metal-oxide-semiconductor-field-effect-transistors (MOSFETs) and in circuits incorporating MOSFETs. MOSFET performance is improved because the silicon/silicon dioxide interface produced along a (100) crystallographic plane produces a lower surface state density and traps fewer carriers than does the silicon/silicon dioxide interface produced at other silicon crystallographic planes.

As further illustrated in FIG. 1, an orientation flat 14 is provided along a portion of the perimeter of the otherwise circular wafer 10. The flat 14, indicates crystallographic orientation, and when it is oriented on a (100) wafer it conventionally corresponds to one of the <011>-type directions lying on the (100) plane. For clarity of description, the flat 14 in the illustrated embodiment will be referred to as corresponding to the [011] direction.

A mask 16 having a plurality of apertures 18 therein is disposed on the wafer surface 12. The mask 16 typically comprises a silicon dioxide, although a variety of other materials, such as silicon nitride, sapphire, spinels, or garnets might be used as well. The apertures 18 each include a substantially straight edge 19 which is parallel to one of the <010> directions in the plane of the substrate surface. As shown in the illustrated conventional structure, each aperture includes a pair of straight, parallel edges 19 each parallel to the [010] direction so as to yield a plurality of striped-shaped features which terminate at the wafer edges. It is not essential that each aperture extend across the entire wafer surface, although the optimum aperture shape is rectangular, with a length/width aspect ratio as high as other design and processing constraints permit. For example, the apertures may be contained within the boundary of the wafer.

Figure 2:
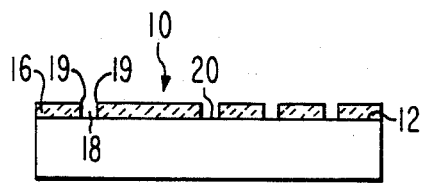
FIGS. 2-4 are sectional views of the conventional wafer of FIG. 1 which illustrate the conventional ELO process sequence and structure formed thereby.

In the illustrated prior art embodiment, four apertures 18 are shown, and FIG. 2 illustrates a sectional view across a diameter of the wafer 10 which is transverse to the aperture 18. The mask layer 16 might have a thickness ranging from approximately 0.1 micron to several microns and the apertures 18 extend through the thickness of the mask layer 16 so as to expose nucleation sites 20 at the surface 12 of the wafer 10. It should additionally be recognized that although the wafer 10 has heretofor been described in terms of being a uniform monocrystalline substrate, it is only necessary that the substrate be monocrystalline and of the indicated orientation in the areas of the nucleation sites 20. For example, the wafer 10 might comprise an amorphous or polycrystalline material so long as the nucleation sites 20 exposed by the apertures 18 are monocrystalline and have surfaces in the (100) plane.

Figure 3:
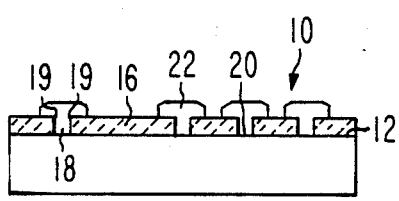

As illustrated in FIG. 3, silicon is next epitaxially deposited such that a monocrystalline island 22 grows from each nucleation site 20, through each aperture 18, and laterally over, the mask 16, in a direction which is perpendicular to the aperture edges 19. So as to assure that each island 22 is a single crystal, the previously disclosed ELO technique is used during the deposition process. As the ELO process continues, each island 22 grows laterally across the surface of the mask 16 in a [001] direction until the islands 22 eventually merge into a single monocrystalline silicon layer 24 overlying the mask 16, as illustrated in FIG. 4.

Figure 4:
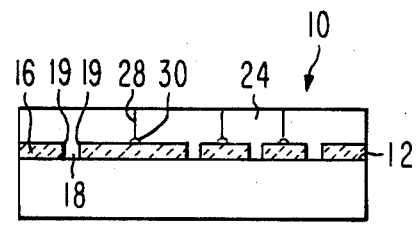

However, as also shown in FIG. 4, we have observed that crystalline defects occur along the interface where neighboring islands 22 merge. Specifically, these defects include voids 30 and line defects 28 such as dislocations. Although the presence of these defects is generally detrimental to the performance of devices subsequently formed in the monocrystalline layer 24, the presence of voids 30 is a particular problem when forming SOI structures, as illustrated in FIG. 5.

Figure 5:
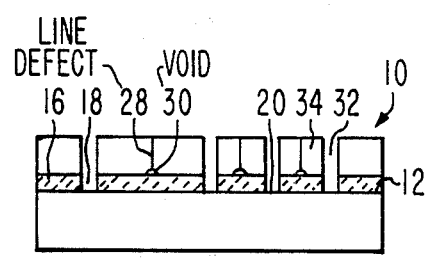
FIG. 5 is a sectional view of an SOI structure fabricated in accordance with the ELO processing sequence described in FIGS. 2-4.

As shown in FIG. 5, an SOI structure can readily be fabricated from the structure shown in FIG. 4. The SOI structure is produced by etching cavities 32 through the monocrystalline layer 24 to the substrate surface 12 in areas corresponding to the apertures 18. In the illustrated embodiment, this yields a plurality of monocrystalline silicon islands 34 which are isolated from the substrate by the mask 16 and are isolated from each other by the cavities 32. The cavities 32 might additionally be filled with a dielectric material so as to further isolate the islands 34 and render a more planar structure.

As the thickness of the silicon islands 34 in the SOI structure is reduced the significance of the voids 30 therein is increased. Clearly, as the size of the void 30 within a silicon island 34 grows, its detrimental impact on the peformance of a solid state device subsequently formed within the island 34 increases.

As illustrated in the transmission electron microscope photomicrographs of FIGS. 6a–6e, we have discovered that by orienting the aperture edges 19 to a critical degree from the [010] direction, the voids 30 can be substantially eliminated and the number of line defects 28 can be reduced.

Figure 6A:
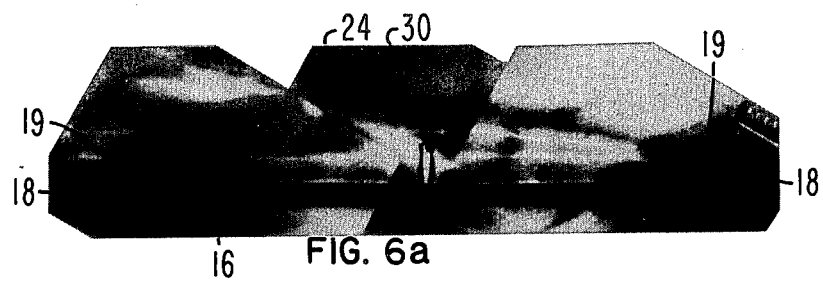
FIGS. 6a-6e are photomicrographs of ELO-processed wafers having different aperture orientations.

FIG. 6a shows a portion of a prior art structure similar to that illustrated in FIG. 4. The photomicrograph shows two apertures 18, each having an edge 19 in the [010] direction; these edges 19 being parallel to each other and in mutual opposition. The mask 16 overlying monocrystalline silicon 24 and void 30 have also been appropriately labeled. FIGS. 6b, 6c, 6d and 6e represent orientations of 4°, 8°, 12° and 16° respectively from the [010] direction. Similar reference numbers preceded by the numerals 1, 2, 3 or 4 have been used to identify corresponding features in each of the structures shown in FIGS. 6b through 6e.

Figure 6B:
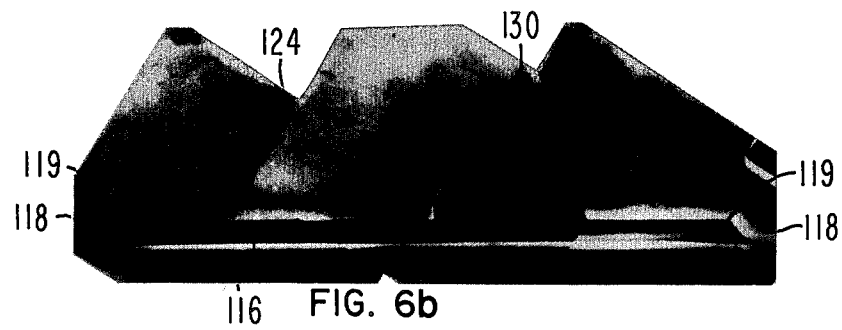

As shown in FIG. 6b, with the aperture edges 119 oriented 4° from the [010] direction, the height of the void 130 has been reduced compared to the void 30 of FIG. 6a.

Figure 6C:
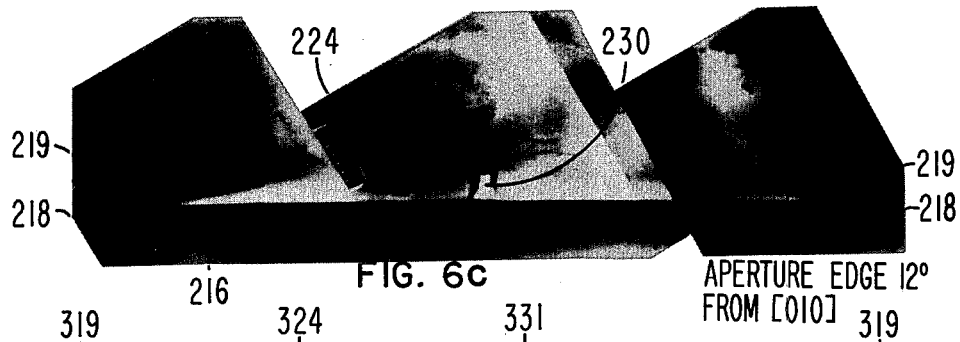

In FIG. 6c, wherein the aperture edges 219 are oriented 8° from the [010] direction, a noticeable decrease in the height of the void 230 can be observed relative to the voids 30 and 130 of the previous illustrations.

Figure 6D:
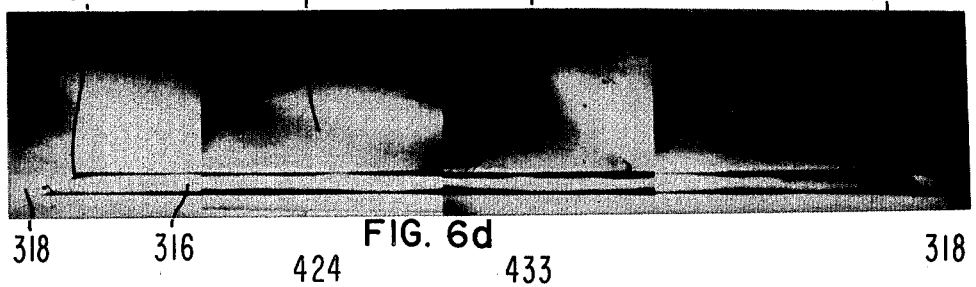

The most significant alteration of the void configuration appears to occur in FIG. 6d wherein the aperture edges 319 are oriented 12° from the [010] direction. As identified at 331 in FIG. 6d, the central portion of the overlying monocrystalline layer 324 which is adjacent to the mask 316 shows the elimination of or perhaps only slight traces of a void. As shown in the photomicrograph, although there appear to be some dislocations present in the area 331 where a void might conventionally be present, the overall quality of the overlying monocrystalline layer 324 is comparable to or better than the crystalline quality of the monocrystalline layer 24 of FIG. 6a. Thus, an aperture edge orientation of approximately 12° from the [010] direction appears to be optimum from the standpoint of eliminating voids yet maintaining crystalline quality.

Figure 6E:
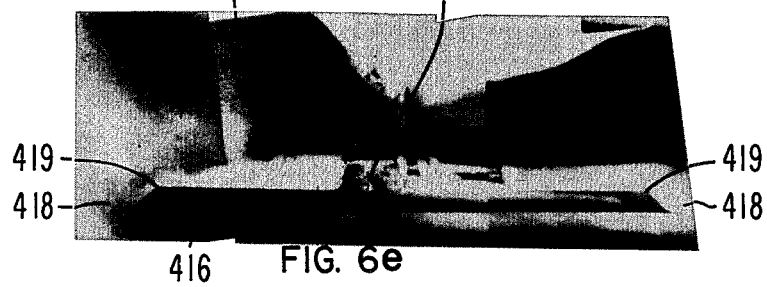

FIG. 6e illustrates an orientation of 16° from the [010] direction. Although there is no apparent void in the central area 433 of the monocrystalline layer 424, there is a significant amount of crystallographic twinning present in this area. This twinning is also detrimental to the performance of a device subsequently fabricated in the monocrystalline layer 424, rendering the structure illustrated in FIG. 6e undesirable for device fabrication.

It is hypothesized that void formation occurs because during the ELO process the silicon-source gas cannot adequately reach the silicon island 22/mask 16 interface as lateral growth fronts from neighboring islands 22 approach and coalesce. When aperture edges 19 are oriented along [010] directions, the lateral growth front for each silicon island 22 consists of a faceted surface which advances across the surface of the mask 16 in a [001] direction. This faceted surface appears to include an (001) plane extending perpendicularly from the mask 16, and is referred to as a vertical facet. As the ELO growth continues, the vertical facets associated with neighboring silicon islands 22 approach each other so as to narrow the spacing between islands. Transport of silicon from the silicon-source gas through this spacing between islands to the surface of the mask 16 becomes increasingly constricted as the height of the vertical facet on each island increases and the spacing between opposing vertical facets decreases. This results in a decreased growth rate at areas near the vertical facet/mask juncture compared to other areas of the faceted surface. This differential growth rate then leads to a morphological breakdown of the growth interface which ultimately closes the spacing between approaching vertical facets at a point removed from the surface of the mask 16, thereby leaving the space between the point of closing and the mask 16 unfilled.

The height of the void thus created appears to increase with the height of the opposing vertical facets on neighboring silicon islands. We hypothesize that by deviating the [010]-oriented mask aperture, and hence the [001] growth direction between 8° and 14° the size of the vertical facets is decreased. This occurs because (1) the lateral growth fronts now advance in directions which are 8° to 14° removed from the [001] direction and the vertical facet on each growth front is no longer parallel to the (001) plane, and (2) growth rates increase with small deviations from the [001] growth direction in silicon. It is well known that a higher growth rate in a particular crystallographic direction reduces the size of a facet which is perpendicular to that direction. As the growth direction deviates from the [001] direction other growth facets tend to dominate growth and decrease the height of the spacing produced by the opposing vertical facets on the neighboring silicon islands.

What is claimed is:

1. A method for forming a layer of monocrystalline diamond cubic material on a mask, comprising:
   providing a substrate having a monocrystalline surface parallel to a {100}-type crystallographic plane;
   forming a mask on the substrate, the mask including at least two apertures, each aperture including an edge which is oriented between 8° and 14° from a particular <001> direction on the surface, the edges being mutually parallel and in mutual opposition and the apertures each exposing a monocrystalline surface portion of the substrate; and
   epitaxially growing diamond cubic material through the apertures and laterally, perpendicular to said aperture edges, so as to form a monocrystalline layer of substantially uniform quality overlying the mask between the edges of the apertures.

2. A method in accordance with claim 1 wherein said diamond cubic material comprises silicon.

3. A method in accordance with claim 1 wherein said mask comprises silicon dioxide.

4. A method in accordance with claim 1 wherein the aperture edges are oriented at substantially 12° from said particular <001> direction.

* * * * *